US011801775B2

(12) United States Patent
Fehling et al.

(10) Patent No.: US 11,801,775 B2
(45) Date of Patent: Oct. 31, 2023

(54) SEAT ADJUSTMENT SWITCH

(71) Applicant: KOSTAL Automobil Elektrik GmbH & Co. KG, Luedenscheid (DE)

(72) Inventors: Andre Fehling, Sundern (DE); Kai Brensel, Witten (DE); Hubert Hille, Menden (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 347 days.

(21) Appl. No.: 17/391,107

(22) Filed: Aug. 2, 2021

(65) Prior Publication Data
US 2021/0354596 A1    Nov. 18, 2021

Related U.S. Application Data

(63) Continuation of application No. PCT/EP2020/056462, filed on Mar. 11, 2020.

(30) Foreign Application Priority Data

Mar. 13, 2019    (DE) .................... 10 2019 001 781.1

(51) Int. Cl.
*B60N 2/90* (2018.01)
*B60N 2/02* (2006.01)
*G05G 9/047* (2006.01)

(52) U.S. Cl.
CPC ....... *B60N 2/0228* (2013.01); *G05G 9/04785* (2013.01); *G05G 2009/04714* (2013.01);
(Continued)

(58) Field of Classification Search
CPC ............. B60N 2/0228; G05G 9/04785; G05G 2009/04714; G05G 2009/04722; G05G 2009/04744; G05G 2009/04762
See application file for complete search history.

(56) References Cited

U.S. PATENT DOCUMENTS 3,223,791 A * 12/1965 Wanlass ................ H01H 35/00
200/557
5,130,501 A    7/1992 Maeda
(Continued)

FOREIGN PATENT DOCUMENTS

DE        69211626 T2     2/1997
DE        19844336 C1     9/1999
(Continued)

OTHER PUBLICATIONS

European Patent Office, International Search Report for International Application No. PCT/EP2020/056462, dated Jun. 18, 2020.
(Continued)

*Primary Examiner* — Philip F Gabler
(74) *Attorney, Agent, or Firm* — Brooks Kushman P.C.

(57) ABSTRACT

A seat adjustment switch includes a multidirectional force sensor, a carrier plate, and a button cap. The multidirectional force sensor is arranged on the carrier plate and includes a sensor pin. The sensor pin is pivotable via which the multidirectional force sensor is actuatable. The button cap is connected to the sensor pin. The button cap serves as an actuating element operable by an operator for pivoting the sensor pin in order to actuate the multidirectional force sensor. The carrier plate includes a receiving sleeve that is integrally formed with the carrier plate and is connected to other portions of the carrier plate via flexible regions, the sensor pin is guided through the receiving sleeve for the multidirectional force sensor to be arranged on the carrier plate. The button cap forms a form-fit connection with the receiving sleeve.

14 Claims, 2 Drawing Sheets

(52) U.S. Cl.
CPC ............. *G05G 2009/04722* (2013.01); *G05G 2009/04744* (2013.01); *G05G 2009/04762* (2013.01)

(56) References Cited

U.S. PATENT DOCUMENTS

| | | | | |
|---|---|---|---|---|
| 5,455,399 | A | 10/1995 | Kohno et al. | |
| 6,515,241 | B2 * | 2/2003 | Saiki | B60N 2/0228 200/18 |
| 6,635,832 | B1 * | 10/2003 | Oster | G05G 9/047 200/18 |
| 6,897,391 | B2 * | 5/2005 | Gavalda | H01H 25/041 200/17 R |
| 6,953,900 | B2 * | 10/2005 | Sottong | B60N 2/0228 200/5 R |
| 7,087,848 | B1 * | 8/2006 | Yamasaki | H01H 25/041 200/18 |
| 7,595,712 | B2 * | 9/2009 | Nishino | G06F 3/0338 345/157 |
| 8,039,767 | B2 * | 10/2011 | Saomoto | G05G 9/047 200/18 |
| 8,822,853 | B2 * | 9/2014 | Jahn | B60N 2/0228 200/17 R |
| 11,747,221 | B2 * | 9/2023 | Fehling | G01D 5/2403 73/780 |

FOREIGN PATENT DOCUMENTS

| | | |
|---|---|---|
| DE | 102014014021 A1 | 3/2016 |
| DE | 102015014878 A1 | 5/2017 |

OTHER PUBLICATIONS

German Patent and Trademark Office, German Search Report for corresponding German Patent Application No. DE 10 2019 001 781.1, dated Nov. 8, 2019.

The International Bureau of WIPO, International Preliminary Report on Patentability for International Application No. PCT/EP2020/056462, dated Aug. 25, 2021.

* cited by examiner

SEAT ADJUSTMENT SWITCH

CROSS-REFERENCE TO RELATED APPLICATIONS

This application is a continuation of International Application No. PCT/EP2020/056462, published in German, with an International filing date of Mar. 11, 2020, which claims priority to DE 10 2019 001 781.1, filed Mar. 13, 2019, the disclosures of which are hereby incorporated in their entirety by reference herein.

TECHNICAL FIELD

The present invention relates to a seat adjustment switch having multiple multidirectional force sensors that are actuatable via sensor pins and situated on a shared carrier plate with at least one button cap as an actuating element being connected to the sensor pins.

BACKGROUND

Seat adjustment switches generally have multiple switching elements via which various functions are controllable. The actuating element(s) of these switching elements is often designed in the form of a stylized seat contour. The seat contour may be designed either in discrete blocks or monolithically. The stylized seat contour can be used to control at least some of the functions of adjusting head restraints up/down and forward/backward, seat backs forward/backward, and seat cushions up/down to the front, up/down to the rear, and forward/backward.

In contrast to past customary contact switches, force sensors having one or more switching thresholds are preferably used in modern seat adjustment switches. The force sensors are usually designed to have a relatively high mechanical stiffness or rigidity.

A generic seat adjustment switch having a force sensor system is known from German Patent Application DE 10 2015 014 878 A1. This document describes in particular a control device for adjusting a motor vehicle seat. A switch cap is supported on a base body of the control device so that it can rotate about at least one rotational axis and move translationally along at least one direction. A detection device(s) detects a displacement of the switch cap by determining the magnitude and direction of the actuating force acting on the switch cap. A vehicle seat can be adjusted as a function of this actuating force.

A simple and advantageous embodiment of a detection device in the form of a capacitive multidirectional force sensor is known from German Patent Application DE 10 2014 014 021 A1, the entire contents of which are hereby incorporated by reference herein.

The multidirectional force sensor described in DE 10 2014 014 021 A1 has a pin-like actuating lever that is rigidly connected to the top part of a housing. The actuating lever is connected to a metal or metal-coated plate inside the housing. When the actuating lever swivels or pivots, the plate at the same time swivels or pivots against metal or metal-coated surfaces on a circuit board. Capacitance values of capacitors formed by the arrangement of the plate and the surfaces change with the swiveling or pivoting motion of the actuating lever. Since the top part of the housing must at the same time be elastically deformed in order to swivel or pivot the actuating lever, the multidirectional force sensor is quite rigid, which in fact is desired for use in a seat adjustment switch. To achieve a particularly rigid design, the actuating lever and the housing top part may be made of metal.

To implement a seat adjustment switch, a button cap, i.e., an actuating element that is operated by the user, must be fastened to the multidirectional force sensor(s).

A disadvantage for a multidirectional force sensor made of metal is the costly postprocessing that is necessary to achieve a suitable shape for attachment of a button cap, such as clips, guide surfaces, or undercuts. Geometries are generally used here that are produced by simple turning processes or by rolling. Milling processes are less frequently used. The metal pins of the multidirectional force sensors are thus provided with knurling, serrated profiles, or feather keys, for example.

Establishing a form-fit connection is generally possible only to a limited extent, so that a button cap is generally fastened with frictional engagement. It has been shown that the connections established in this way often do not meet the requirements regarding pull-off and torsional forces across all tolerance positions and temperature ranges.

SUMMARY

An object is to provide a generic seat adjustment switch that allows a particularly stable connection of a button cap to sensor pins in a particularly simple and cost-effective manner.

Embodiments of the present invention provide a seat adjustment switch having multidirectional (multi-dimensional; multi-way) force sensors arranged on a common carrier plate. The force sensors are actuatable via respective sensor pins. The sensor pins are guided through receiving sleeves of the carrier plate for the sensors to be arranged on the carrier plate. The receiving sleeves of the carrier plate are formed integrally with the carrier plate and are connected to other portions of the carrier plate via flexible regions. The seat adjustment switch further includes at least one button cap that is connected to the sensor pins and functions as an actuating element for actuating the force sensors. The at least one button cap forms form-fitting or positive connections to the receiving sleeves.

In carrying out at least one of the above and/or other objects, a seat adjustment switch is provided. The seat adjustment switch includes a multidirectional force sensor, a carrier plate, and a button cap. The force sensor is arranged on the carrier plate and includes a sensor pin. The sensor pin is pivotable via which the force sensor is actuatable. The button cap is connected to the sensor pin. The button cap serves as an actuating element operable by an operator for pivoting the sensor pin to actuate the force sensor. The carrier plate includes a receiving sleeve that is integrally formed with the carrier plate and is connected to other portions of the carrier plate via flexible regions. The sensor pin is guided through the receiving sleeve for the force sensor to be arranged on the carrier plate. The button cap forms a form-fit connection with the receiving sleeve.

The flexible regions may be weakened ring-shaped regions of the carrier plate around the receiving sleeve. The flexible regions may have a bellows-like design.

The force sensor may further include a sensor plate with the sensor pin being connected to the sensor plate and protruding from the sensor plate. In embodiments, the sensor plate and the sensor pin are metallic. The sensor pin may be a cylindrical sensor pin.

The seat adjustment switch may further include a second multidirectional force sensor having a second sensor pin via which the second force sensor is actuatable. The button cap is connected to the second sensor pin and serves as an actuating element operable by an operator for actuating the second force sensor. The carrier plate includes a second receiving sleeve that is integrally formed with the carrier plate and is connected to other portions of the carrier plate via flexible regions. The second sensor pin is guided through the second receiving sleeve for the second force sensor to be arranged on the carrier plate. The button cap forms a form-fit connection with the second receiving sleeve.

In another variation in which the seat adjustment switch further includes a second multidirectional force sensor having a second sensor pin via which the second force sensor is actuatable, the seat adjustment switch further includes a second button cap connected to the second sensor pin. The second button cap serves as an actuating element operable by an operator for actuating the second multidirectional force sensor. The carrier plate includes a second receiving sleeve that is integrally formed with the carrier plate and is connected to other portions of the carrier plate via flexible regions. The second sensor pin is guided through the second receiving sleeve for the second force sensor to be arranged on the carrier plate. The second button cap forms a form-fit connection with the second receiving sleeve.

In embodiments of the present invention, the sensor pins of the multidirectional force sensors are guided through receiving sleeves that are integrally formed with the carrier plate and connected to other portions of the carrier plate via flexible regions, and the button cap(s) that is connected to the sensor pins forms form-fit connections with the receiving sleeves.

BRIEF DESCRIPTION OF THE DRAWINGS

An exemplary embodiment of the present invention is explained in greater detail below with reference to the drawings, which show the following.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
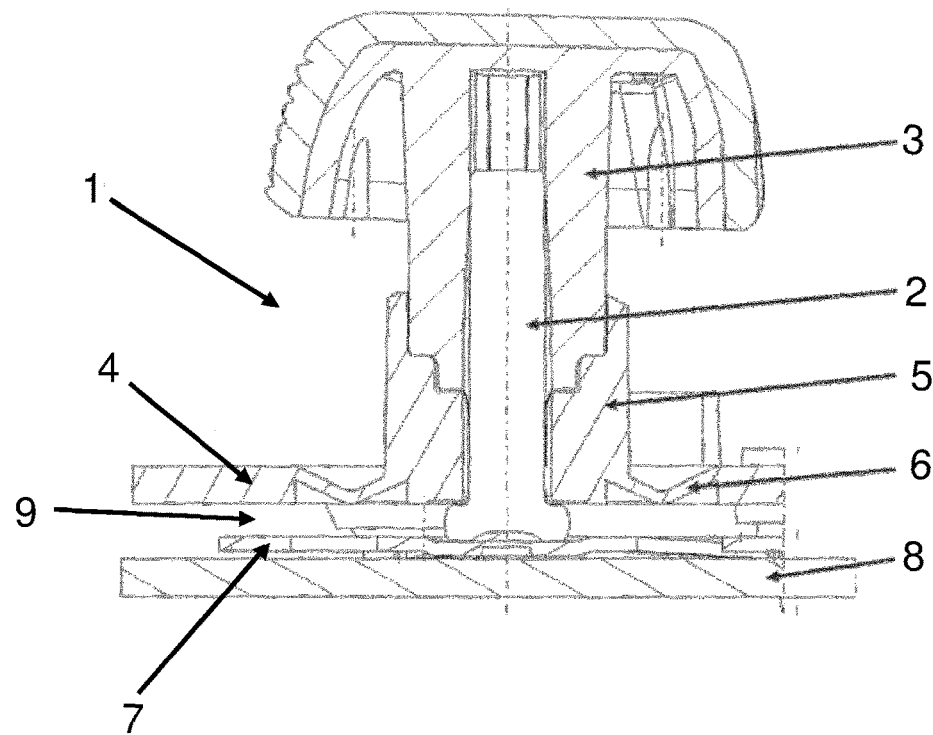
FIG. 1 illustrates a cross-sectional view of a seat adjustment switch having multidirectional force sensors, a carrier plate, and a button cap in accordance with embodiments of the present invention.

Referring now to FIG. 1, a seat adjustment switch in accordance with embodiments of the present invention is shown. The seat adjustment switch includes a plurality of multidirectional force sensors 1, a carrier plate 4, and a button cap 3. FIG. 1 illustrates an installed view of the seat adjustment switch along a cross-section of one of the multidirectional force sensors 1 with button cap 3 attached thereto.

Multidirectional force sensor 1 functions according to a capacitive measuring principle. Multidirectional force sensor 1 includes a metallic sensor element 9 and a printed circuit board 8. Circuit board 8 includes conductor structures (not shown) mounted thereon.

Figure 3:
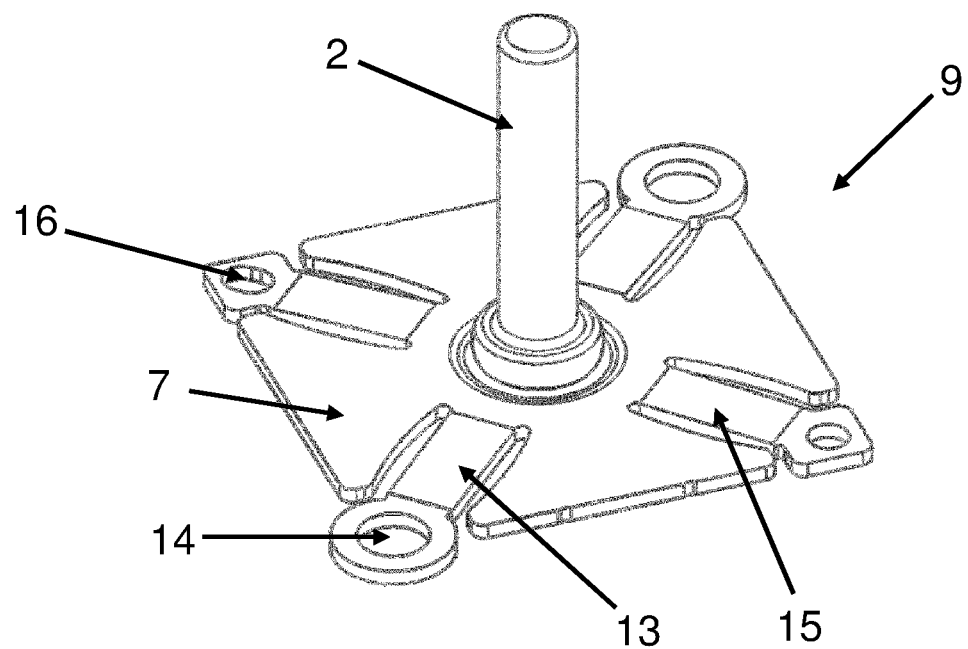
FIG. 3 illustrates an individual view of the sensor element of the seat adjustment switch.

FIG. 3 illustrates an individual view of sensor element 9. Sensor element 9 includes a generally cylindrical metallic sensor pin 2 and a metallic or metal-coated sensor plate 7. The lower end of sensor pin 2 is connected to sensor plate 7. Sensor pin 2 can swivel or pivot about its longitudinal axis. As sensor plate 7 is connected to the lower end of sensor pin 2, the sensor plate swivels or pivots in correspondence with the swiveling or pivoting of the sensor pin.

As a result of sensor pin 2 swiveling or pivoting, the relative position of sensor plate 7 with respect to the conductor structures situated on circuit board 8 changes. Sensor plate 7 together with these individual conductor structures forms capacitors whose capacitance values change with the swiveling or pivoting of sensor plate 7. These changes in capacitance may be evaluated by an electronics system (not shown) in order to determine the change in position of sensor plate 7 and thus determine the actuating force acting on sensor pin 2.

The swiveling or pivoting of sensor pin 2 takes place by means of an operator manipulating button cap 3. More descriptively, button cap 3 is connected to sensor pin 2 and serves as an actuating element operable by an operator for actuating multidirectional force sensor 1. In this way, force sensor 1 is actuatable via sensor pin 2.

In this exemplary embodiment, the seat adjustment switch has a total of five such multidirectional force sensors 1 by way of example. The five force sensors 1 may be connected either to multiple individual button caps 3 or to a shared button cap 3.

Figure 2:
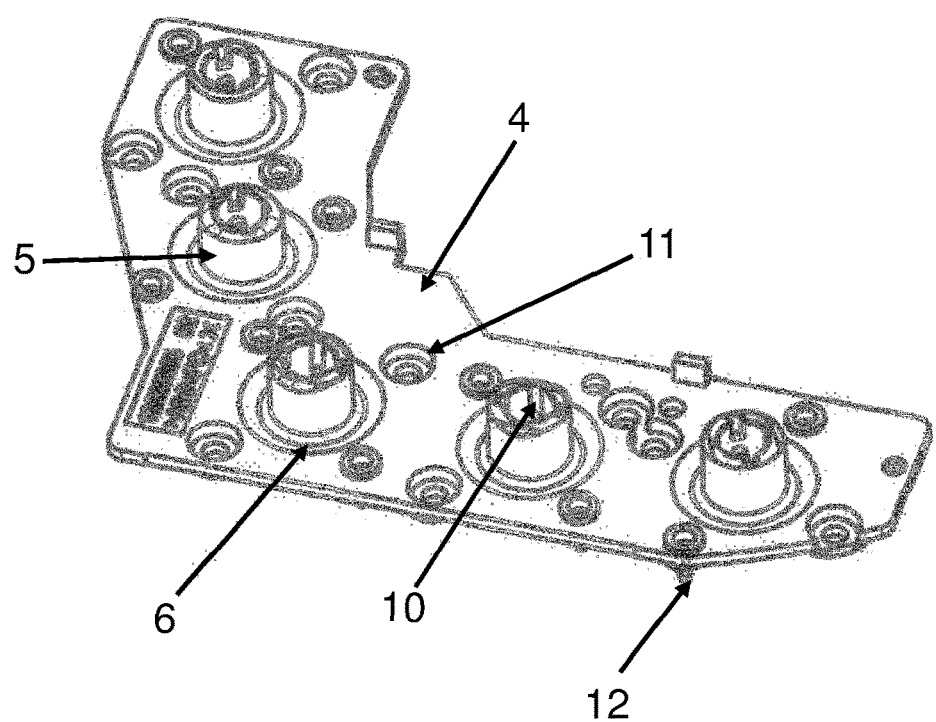
FIG. 2 illustrates an individual view of the carrier plate of the seat adjustment switch.

FIG. 2 illustrates an individual view of carrier plate 4. Multidimensional force sensors 1 are situated at carrier plate 4. Carrier plate 4 is provided for arranging and fastening sensor elements 9 and to achieve stable coupling between button cap 3 and sensor pins 2 of sensor elements 9.

Carrier plate 4, depicted in FIG. 2 as a separate component, may alternatively be integrally formed in an existing housing. Carrier plate 4 includes receiving sleeves 5 that are integrally formed with the carrier plate and are connected to other portions of the carrier plate via flexible regions 6.

Carrier plate 4 depicted in FIG. 2 is designed as a flat plate that is injection-molded from a plastic, onto which multiple receiving sleeves 5, in the present case five, corresponding to the provided number of force sensors, are integrally formed. The longitudinal axes of receiving sleeves 5 are oriented perpendicularly with respect to the plane of carrier plate 4. Multiple screw holes 11 are discernible around each of receiving sleeves 5. Centering pins 12 that protrude perpendicularly from the bottom side (or underside) of carrier plate 4 are situated around receiving sleeves 5.

As noted, a single sensor element 9 is illustrated in FIG. 3. Sensor element 9 is made up of an originally square or rectangular metal plate from which strip-shaped screw tabs 13 and centering arms 15 have been cut free in the direction of the diagonals of the metal plate. End portions of screw tabs 13 and centering arms 15 form screw eyes 14 and centering eyes 16, respectively. Centering eyes 16 are designed as a combination of an elongated hole and a hole for the purpose of centering sensor element 9 with respect to carrier plate 4.

The portion of the metal plate that is connected in one piece to screw tabs 13 and centering arms 15 thus forms an approximately cloverleaf-shaped sensor plate 7. The center of sensor plate 7 is fixedly connected to the vertically protruding cylindrical sensor pin 2.

After the seat adjustment switch is installed (such as shown in FIG. 1) multiple sensor elements 9 are situated at the bottom side of carrier plate 4 illustrated in FIG. 2, sensor pins 2 of the sensor elements being inserted into receiving sleeves 5, and screw tabs 13 being joined to screw eyes 14 by screwing via screw holes 11 of carrier plate 4. For exact positioning, centering pins 12 situated at the bottom side of the carrier plate 4 are inserted into centering eyes 16 of sensor element 9.

As is apparent from FIG. 1, sensor pins 2 of force sensors 1 are each guided through a respective receiving sleeve 5 of carrier plate 4 for the force sensor 1 to be arranged on carrier plate 4. Receiving sleeves 5 in each case concentrically enclose a portion of the sensor pin length.

To enable the swiveling or pivoting capability of sensor pins 2, carrier plate 4 around receiving sleeves 5 in each case forms a circumferential flexible region 6 having the shape of a meander or bellows, at the same time with a greatly reduced wall thickness. In addition, this embodiment offers the advantage that multidirectional force sensors 1 are protected from moisture and dust, since the circumferential flexible regions 6 between receiving sleeves 5 and the further regions of carrier plate 4 in each case form a closed surface.

During manufacture of carrier plate 4, it is advantageous that, due to the large-surface connection of these thinned-out flexible regions 6, there is still sufficient cross section to fill the internal region of the receiving sleeves during the injection molding process without having to provide separate injection points.

It is also apparent in FIG. 1 that the free end portion of sensor pin 2 is inserted into button cap 3 and is surrounded by inner walls that are molded into button cap 3. The outer walls of button cap 3 are inserted into the upper, expanded portion of receiving sleeve 5.

Receiving sleeves 5 are designed in such a way that they establish form-fit or positive connections with button cap 3 and are able to absorb the tensile forces and torques that are introduced into button cap 3. For establishing a form-fit or positive connection, receiving sleeves 5 may have molded-in grooves 10, as is apparent in FIG. 2. Molded-on bars may be inserted into these grooves 10 at button cap 3.

Since on the one hand a form-fit connection thus exists between button cap 3 and receiving sleeves 5, and on the other hand sensor pins 2 are in each case surrounded by a receiving sleeve 5 and also by button cap 3, additional frictional or form-fit connections between sensor pins 2 and button cap 3 are not necessary.

Therefore, as shown best in FIG. 3, sensor pins 2 may each be designed as a simple cylindrical metal pin. Complicated postprocessing operations for molding on connecting structures at end portions of sensor pins 2 may thus advantageously be dispensed with.

LIST OF REFERENCE NUMERALS 1 multidirectional force sensor
2 sensor pin
3 button cap
4 carrier plate
5 receiving sleeve
6 flexible regions
7 sensor plate
8 circuit board
9 sensor element
10 grooves
11 screw holes
12 centering pins
13 screw tabs
14 screw eyes
15 centering arms
16 centering eyes While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A seat adjustment switch comprising:
a multidirectional force sensor including a sensor pin, the sensor pin is pivotable via which the multidirectional force sensor is actuatable;
a carrier plate on which the multidirectional force sensor is arranged;
a button cap connected to the sensor pin, the button cap serving as an actuating element operable by an operator for pivoting the sensor pin in order to actuate the multidirectional force sensor; and
wherein the carrier plate includes a receiving sleeve that is integrally formed with the carrier plate and is connected to other portions of the carrier plate via flexible regions, the sensor pin is guided through the receiving sleeve for the multidirectional force sensor to be arranged on the carrier plate; and
the button cap forms a form-fit connection with the receiving sleeve.

2. The seat adjustment switch of claim 1 wherein:
the flexible regions are weakened ring-shaped regions of the carrier plate around the receiving sleeve.

3. The seat adjustment switch of claim 2 wherein:
the flexible regions have a bellows-like design.

4. The seat adjustment switch of claim 1 wherein:
the flexible regions have a bellows-like design.

5. The seat adjustment switch of claim 1 wherein:
the multidirectional force sensor further includes a sensor plate; and
the sensor pin is connected to the sensor plate and protrudes from the sensor plate.

6. The seat adjustment switch of claim 5 wherein:
the sensor plate and the sensor pin are metallic.

7. The seat adjustment switch of claim 1 wherein:
the sensor pin is a cylindrical sensor pin.

8. The seat adjustment switch of claim 1 further comprising:
a second multidirectional force sensor including a second sensor pin via which the second multidirectional force sensor is actuatable; and
wherein the button cap is connected to the second sensor pin, the button cap serving as an actuating element operable by an operator for actuating the second multidirectional force sensor; and
the carrier plate includes a second receiving sleeve that is integrally formed with the carrier plate and is connected to other portions of the carrier plate via flexible regions, the second sensor pin is guided through the second receiving sleeve for the second multidirectional force sensor to be arranged on the carrier plate; and
the button cap forms a form-fit connection with the second receiving sleeve.

9. The seat adjustment switch of claim 1 further comprising:
- a second multidirectional force sensor including a second sensor pin via which the second multidirectional force sensor is actuatable;
- a second button cap connected to the second sensor pin, the second button cap serving as an actuating element operable by an operator for actuating the second multidirectional force sensor; and
- wherein the carrier plate includes a second receiving sleeve that is integrally formed with the carrier plate and is connected to other portions of the carrier plate via flexible regions, the second sensor pin is guided through the second receiving sleeve for the second multidirectional force sensor to be arranged on the carrier plate; and
- the second button cap forms a form-fit connection with the second receiving sleeve.

10. A seat adjustment switch comprising:
- multiple multidirectional force sensors that are actuatable via sensor pins and situated on a shared carrier plate;
- at least one button cap as an actuating element being connected to the sensor pins;
- wherein the sensor pins are guided through receiving sleeves that are integrally formed with the carrier plate and connected to other portions of the carrier plate via flexible regions; and
- the at least one button cap forms form-fit connections with the receiving sleeves.

11. The seat adjustment switch of claim 10 wherein:
the flexible regions are formed by weakened ring-shaped regions of the carrier plate around the receiving sleeves.

12. The seat adjustment switch of claim 11 wherein:
the flexible regions have a bellows-like design.

13. The seat adjustment switch of claim 10 wherein:
the flexible regions have a bellows-like design.

14. The seat adjustment switch of claim 10 wherein:
the multidirectional force sensors each have a sensor plate and the sensor pin protrudes perpendicularly from the sensor plate, the sensor plate and the sensor pin being metallic.

\* \* \* \* \*